US012784799B2

(12) United States Patent
Lee et al.

(10) Patent No.: US 12,784,799 B2
(45) Date of Patent: Nov. 3, 2026

(54) MEMORY DEVICE INCLUDING FERROELECTRIC CELL CAPACITOR AND OPERATING METHOD THEREOF

(71) Applicant: SAMSUNG ELECTRONICS CO., LTD., Suwon-si (KR)

(72) Inventors: Hwayeong Lee, Suwon-si (KR); Seulji Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 28 days.

(21) Appl. No.: 18/891,518

(22) Filed: Sep. 20, 2024

(65) Prior Publication Data

US 2025/0157518 A1 May 15, 2025

(30) Foreign Application Priority Data

Nov. 9, 2023 (KR) ........................ 10-2023-0154740

(51) Int. Cl.
*G11C 11/22* (2006.01)
*H10B 53/30* (2023.01)

(52) U.S. Cl.
CPC ........ *G11C 11/221* (2013.01); *G11C 11/2255* (2013.01); *G11C 11/2257* (2013.01); *G11C 11/2273* (2013.01); *G11C 11/2275* (2013.01); *H10B 53/30* (2023.02)

(58) Field of Classification Search
CPC .............. G11C 11/221; G11C 11/2255; G11C 11/2257; G11C 11/2273; G11C 11/2275; G11C 8/10; H10B 53/30
USPC .......................................................... 365/145
See application file for complete search history.

(56) References Cited

U.S. PATENT DOCUMENTS

| | | | |
|---|---|---|---|
| 6,363,002 B1 | 3/2002 | Nishimura et al. | |
| 6,704,218 B2 | 3/2004 | Rickes et al. | |
| 7,142,444 B2 | 11/2006 | Nishihara et al. | |
| 7,733,682 B2 | 6/2010 | Madan | |
| 8,199,554 B2 | 6/2012 | Hashimoto et al. | |
| 9,530,481 B2 | 12/2016 | Doi | |
| 10,332,596 B2 | 6/2019 | Tandingan et al. | |
| 11,482,270 B1 * | 10/2022 | Dokania | H10B 53/30 |
| 11,501,814 B2 | 11/2022 | Fackenthal | |
| 2022/0254399 A1 | 8/2022 | Vimercati | |
| 2024/0206150 A1 * | 6/2024 | Sakui | G11C 11/404 |

FOREIGN PATENT DOCUMENTS

| | | | |
|---|---|---|---|
| CN | 101814313 | 8/2010 | |
| CN | 109155140 A * | 1/2019 | G11C 11/22 |
| JP | 4908562 | 4/2012 | |
| JP | 2016-066394 | 4/2016 | |
| KR | 10-2003-0079739 | 10/2003 | |
| KR | 10-2004-0084696 | 10/2004 | |

* cited by examiner

*Primary Examiner* — Huan Hoang
(74) *Attorney, Agent, or Firm* — Fish & Richardson P.C.

(57) ABSTRACT

An operating method of a memory device includes, during a write operation, in a first time period, pre-charging a bit line connected to a memory cell with a ground voltage, during the write operation, in a second time period, applying a word line driving voltage to a word line corresponding to the bit line, in the second time period, applying a plate line driving voltage to a plate line connected to the memory cell, and in the second time period, maintaining a voltage applied to the bit line at the ground voltage.

20 Claims, 16 Drawing Sheets

MEMORY DEVICE INCLUDING FERROELECTRIC CELL CAPACITOR AND OPERATING METHOD THEREOF

CROSS-REFERENCE TO RELATED APPLICATION

This application is based on and claims priority under 35 U.S.C. § 119 to Korean Patent Application No. 10-2023-0154740, filed on Nov. 9, 2023, in the Korean Intellectual Property Office, the disclosure of which is incorporated by reference herein in its entirety.

BACKGROUND

The present disclosure relates to a memory device, and specifically, to a memory device including a ferroelectric cell capacitor and an operating method thereof.

Recently, as electronic products increase in speed and decrease in power, devices with a fast read/write operation and a low operating voltage of a semiconductor device embedded in electronic products are in demand. Ferroelectric memory involves ferroelectricity in which internal electric dipole moments are aligned and maintain spontaneous polarization even when an electric field is not applied from the outside. In particular, highly-integrated ferroelectric memory may perform a high-speed read operation and a high-speed write operation and may have non-volatility and is a candidate for next-generation memory.

SUMMARY

The present disclosure provides a memory device including a ferroelectric cell capacitor and an operating method thereof, wherein the memory device performs a write operation by adjusting a voltage, which is to be applied to a word line and a plate line, without applying a voltage to a bit line (e.g., ground voltage).

A first, general aspect is an operating method of a memory device, the operating method including: during a write operation, in a first time period, pre-charging a bit line connected to a memory cell with a ground voltage, during the write operation, in a second time period, applying a word line driving voltage to a word line corresponding to the bit line, in the second time period, applying a plate line driving voltage to a plate line connected to the memory cell, and in the second time period, maintaining a voltage applied to the bit line at the ground voltage.

A second, general aspect is an operating method of a memory device, the operating method including: during a read operation, in a first time period, applying a ground voltage to a first plate line connected to a first memory cell and a second plate line connected to a second memory cell, in the first time period, applying the ground voltage to a bit line commonly connected to the first memory cell and the second memory cell, during the read operation, in a second time period, reading data stored in one of the first memory cell and the second memory cell by performing a charge sharing operation, during the read operation, in a third time period, applying a first plate line driving voltage to a plate line corresponding to a memory cell storing first data among the first and second memory cells, and in the third time period, applying a second plate line driving voltage to a plate line corresponding to a memory cell storing second data among the first and second memory cells.

A third, general aspect is a memory device including: a memory cell array including a first layer including a plurality of first memory cells and a second layer including a plurality of second memory cells, a first plate line decoder connected to the first layer, a second plate line decoder connected to the second layer, a common bit line connected to the first layer and the second layer, and a word line decoder connected to the first layer and the second layer, wherein, during a write operation on the memory cell array, a voltage applied to the common bit line is maintained at a ground voltage.

DETAILED DESCRIPTION

Figure 1:
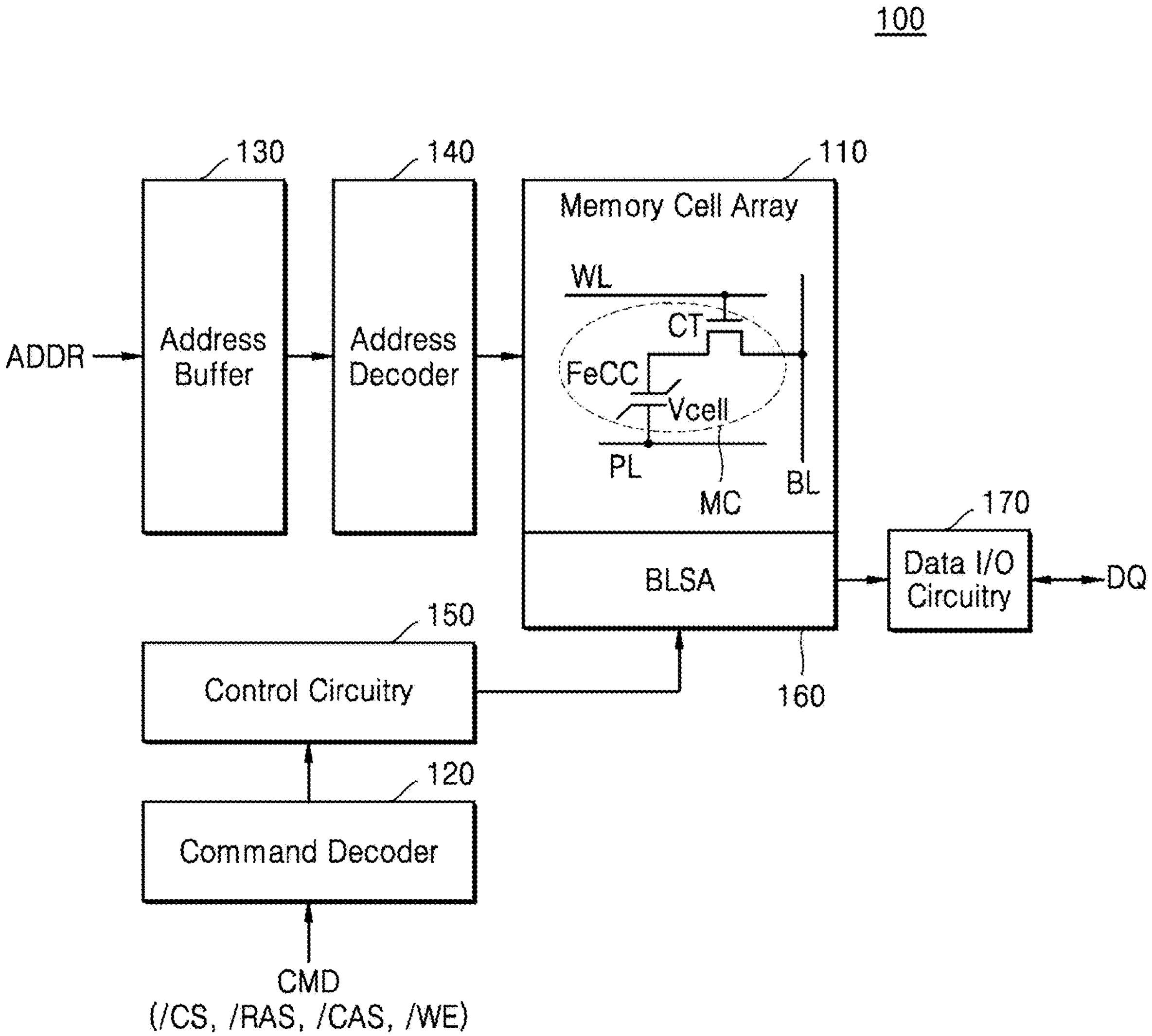
FIG. 1 is a block diagram of an example of a memory device.

FIG. 1 is an example of a block diagram of a memory device.

Referring to FIG. 1, a memory device 100 includes a memory cell array 110, a command decoder 120, an address buffer 130, an address decoder 140, control circuitry 150, a sense amplifier (also referred to as a bit line sense amplifier (BLSA)) 160, and data input/output circuitry 170.

The memory device 100 may be a ferroelectric random access memory (FeRAM) that senses, as data, a cell voltage Vcell stored in a memory cell MC. In this regard, the FeRAM may be referred to as FRAM.

The memory device 100 may input/output data DQ according to a command CMD and an address ADDR that are received from an external device (for example, a central processing unit (CPU) or a memory controller).

The memory cell array 110 may include a plurality of memory cells MCs. The memory cell array 110 may include a plurality of word lines WLs respectively connected to the memory cells MCs, a plurality of bit lines BLs, and a plurality of plate lines PLs.

Each of the memory cells MCs may include a cell transistor CT and a ferroelectric cell capacitor FeCC. A gate end of the cell transistor CT may be connected to one of the word lines WLs of the memory cell array 110. A first end of the cell transistor CT may be connected to one of the bit lines BLs of the memory cell array 110. A second end of the cell transistor CT may be connected to a first end of the ferroelectric cell capacitor FeCC. A second end of the ferroelectric cell capacitor FeCC may be connected to one of the plate lines PLs of the memory cell array 110. The ferroelectric cell capacitor FeCC may store a certain capacity of charges corresponding to data. The ferroelectric cell capacitor FeCC is described in detail with reference to FIG. 2.

The memory cell MC may store, in the ferroelectric cell capacitor FeCC, the cell voltage Vcell having a size that specifies data.

The command decoder 120 may determine the input command CMD by referring to a chip select signal/CS, a row address strobe signal/RAS, a column address strobe signal/CAS, a write enable signal/WE, etc. applied from an external device. The command decoder 120 may generate control signals corresponding to the command CMD. The command CMD may include an active command, a read command, a write command, a pre-charge command, etc.

The address buffer 130 receives the address ADDR applied from an external device. The address ADDR includes a word line address that addresses some of the word lines WLs connected to the memory cell array 110, a bit line address that addresses some of the bit lines BLs connected to the memory cell array 110, and a plate line address that addresses some of the plate lines PLs connected to the memory cell array 110. The address buffer 130 may transmit each of the word line address, the bit line address, and the plate line address to the address decoder 140.

The address decoder 140 may include a word line decoder, a bit line decoder, and a plate line decoder, which respectively select a word line WL, a bit line BL and a plate line PL of a memory cell MC to be accessed according to the received address ADDR.

The word line decoder may activate the word line WL of the memory cell MC, which corresponds to the word line address, by decoding the word line address. The bit line decoder may provide a bit line select signal BLS that selects the bit line BL of the memory cell MC, which corresponds to the bit line address, by decoding the bit line address. The plate line decoder may provide a plate line select signal PLS that selects the plate line PL of the memory cell MC, which corresponds to the plate line address, by decoding the plate line address.

The control circuitry 150 may control the BLSA 160 under control by the command decoder 120. The control circuitry 150 may control an operation of sensing, by the BLSA 160, the cell voltage Vcell of the memory cell MC. The control circuitry 150 may control the BLSA 160 to perform a pre-charge operation, a charge sharing operation, and a sensing operation.

The BLSA 160 may sense, as data, a charge stored in the memory cell MC. In addition, the BLSA 160 may transmit the sensed data to the data input/output circuitry 170 so as to allow the sensed data to be output to the outside of the memory device 100 via a data DQ pad(s).

The data input/output circuitry 170 may receive, from the outside, the data DQ to be written to the memory cells MCs and transmit the data DQ to the memory cell array 110. The data input/output circuitry 170 may output, as read data, bit data sensed by the BLSA 160, to the outside via the data DQ pad(s).

In some implementations, during a write operation, a voltage applied to the bit line BL may be maintained at a ground voltage. In addition, because memory cells included in different layers share a bit line and are respectively connected to different plate lines, different data may be written for each layer by adjusting a voltage for each plate line.

First, the ferroelectric cell capacitor FeCC is described with reference to FIG. 2.

Figure 2:
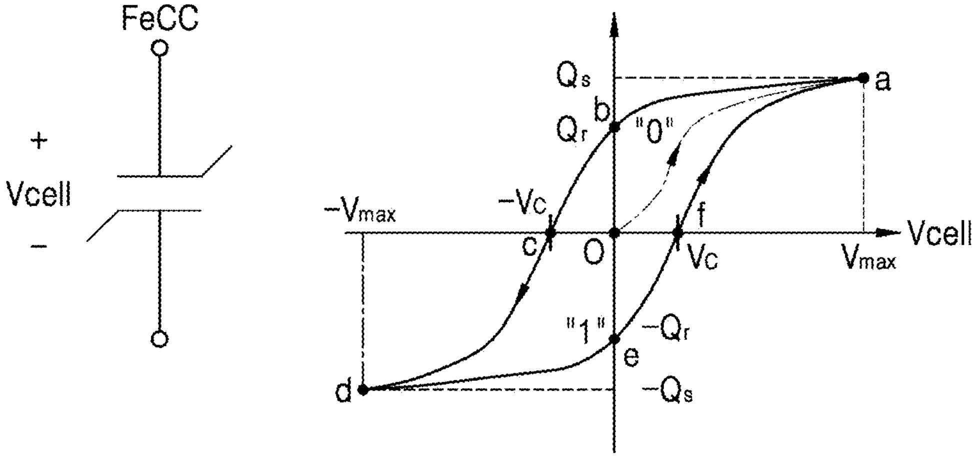
FIG. 2 is a diagram illustrating an example of a ferroelectric cell capacitor.

FIG. 2 is a diagram illustrating an example of the ferroelectric cell capacitor FeCC.

The ferroelectric cell capacitor FeCC may include a material having ferroelectricity. At this time, the ferroelectric cell capacitor FeCC may include one of PZT, SBT, and BLT as a material having ferroelectricity. In addition, the ferroelectric cell capacitor FeCC may include, for example, at least one of hafnium oxide, hafnium zirconium oxide, zirconium oxide, barium strontium titanium oxide, barium titanium oxide, and lead zirconium titanium oxide. In this case, hafnium zirconium oxide may be a material in which hafnium oxide is doped with zirconium (Zr), or may be a compound of hafnium (Hf), zirconium (Zr), and oxygen (O). The ferroelectric cell capacitor FeCC may further include the material described above doped with a doping element. The doping element may be an element selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn).

Referring to FIG. 2, the hysteresis loop characteristics of the ferroelectric cell capacitor FeCC are shown. In this regard, $P_r$ refers to remnant polarization, $P_s$ refers to saturation polarization, and $V_c$ refers to a coercive voltage. The coercive voltage refers to the magnitude of a voltage that causes the polarization of the ferroelectric cell capacitor FeCC to have no polarization, e.g., have 0 dipole moment, and the remnant polarization and the saturation polarization are described below.

Referring to FIG. 2, an initial state at the origin in which the cell voltage Vcell is 0 V and the polarization Q is 0 is shown. The cell voltage Vcell can be proportional to an electric field experienced by the ferroelectric cell.

When the level of the cell voltage Vcell applied to the ferroelectric cell capacitor FeCC gradually increases from 0 V, polarization may occur in the ferroelectric cell capacitor FeCC such that the total polarization of the ferroelectric cell capacitor FeCC may increase up to $P_s$ (point a), as shown by a dashed line in FIG. 2. At this time, a state at the point a at which the level of a voltage applied to the ferroelectric cell capacitor FeCC is greater than the level of a first voltage may be referred to as saturation polarization of the ferroelectric cell capacitor FeCC. In this regard, the level of the first voltage may be $V_{max}$.

In a saturation polarization state, when the level of a voltage applied to the ferroelectric cell capacitor FeCC is reduced, a polarization (Q) of the ferroelectric cell capacitor FeCC may decrease along a solid curved line backwards (from the point a to a point b) rather than following the straight dashed line. At the point b shown in FIG. 2, even though the level of a voltage applied to the ferroelectric cell capacitor FeCC is 0 V, the total polarization of the ferroelectric cell capacitor FeCC has a finite value, $P_r$, and $P_r$ may be referred to as remnant polarization.

At the point b, when a voltage (e.g., reverse voltage) having a negative level is applied to the ferroelectric cell capacitor FeCC and the magnitude of the reverse voltage is gradually increased, the polarization follows a curve from point b to a point c, where there is no net polarization. After this passing this point, e.g., continuing to even more negative voltages, polarization in the opposite direction occurs. Eventually, negative saturation may occur at a point d.

At the point d, when the reverse voltage applied to the ferroelectric cell capacitor FeCC is reduced and the magnitude of a forward voltage is decreased, e.g., the negative voltage is approach zero, until the voltage reaches a point e. As a positive voltage is applied again, starting from point e, the magnitude of the negative polarization decreases, e.g., the polarization increases. At point f, the total polarization is 0, although a positive coercive voltage Vc is being applied. From the point f, when the applied voltage increases, the total polarization will increase until reaching point a. From here, the polarization as function of voltage can cycle through this hysteresis loop.

In other words, the net polarization of the ferroelectric cell capacitor FeCC may correspond to two solid curves (solid curve abcd and solid curve defa). As such, the fact that the polarization value varies depending on hysteresis may be referred to as a hysteresis loop characteristic.

Hereinafter, it is assumed that when the level of a voltage applied to the ferroelectric cell capacitor FeCC is 0 V, the net polarization of the ferroelectric cell capacitor FeCC is one of $P_r$ indicating data "0" and $-P_r$ indicating data "1". In other words, hereinafter, it is assumed that the ferroelectric cell capacitor FeCC is in a stable state.

In some implementations, when the net polarization of the ferroelectric cell capacitor FeCC is $-P_r$, $-P_r$ may correspond to data "0", and when the net polarization of the ferroelectric cell capacitor FeCC is $P_r$, $P_r$ may correspond to data "1", but the present disclosure is not limited thereto.

Figure 3A:
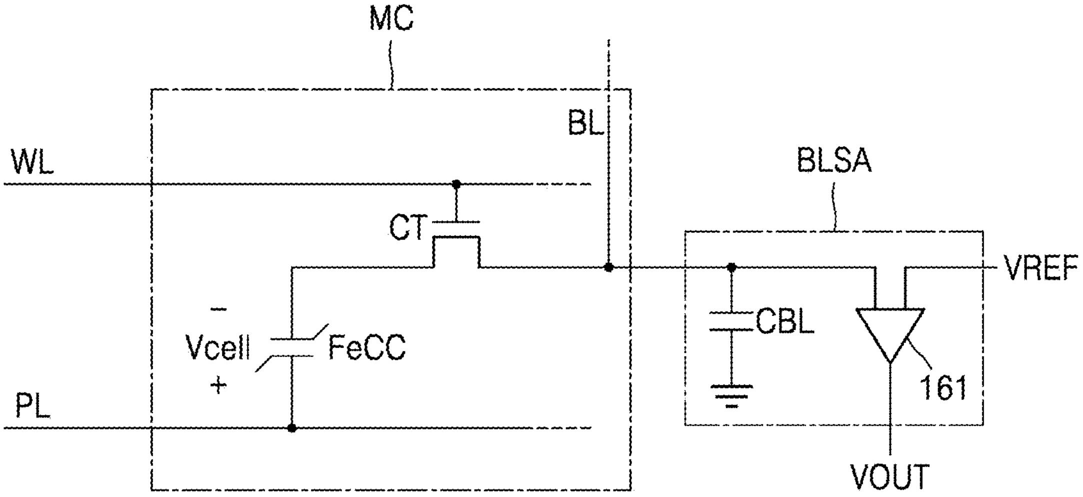
FIGS. 3A and 3B are block diagrams of an example of a memory cell and an example of a sense amplifier.
Figure 3B:
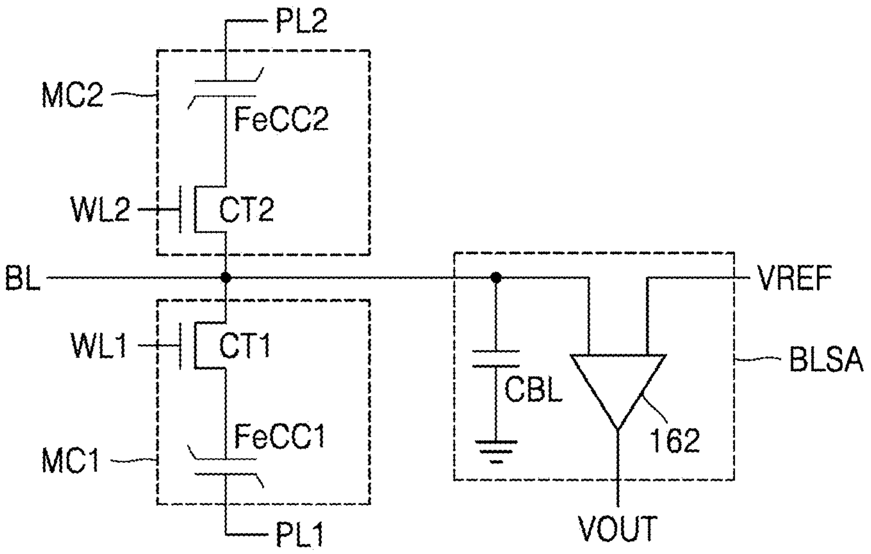
Figure 4:
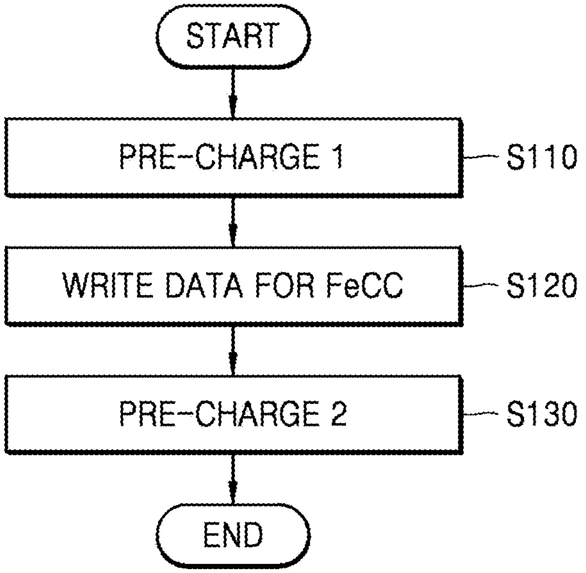
FIG. 4 is a flowchart of an example of a write operation of a memory device.
Figure 5:
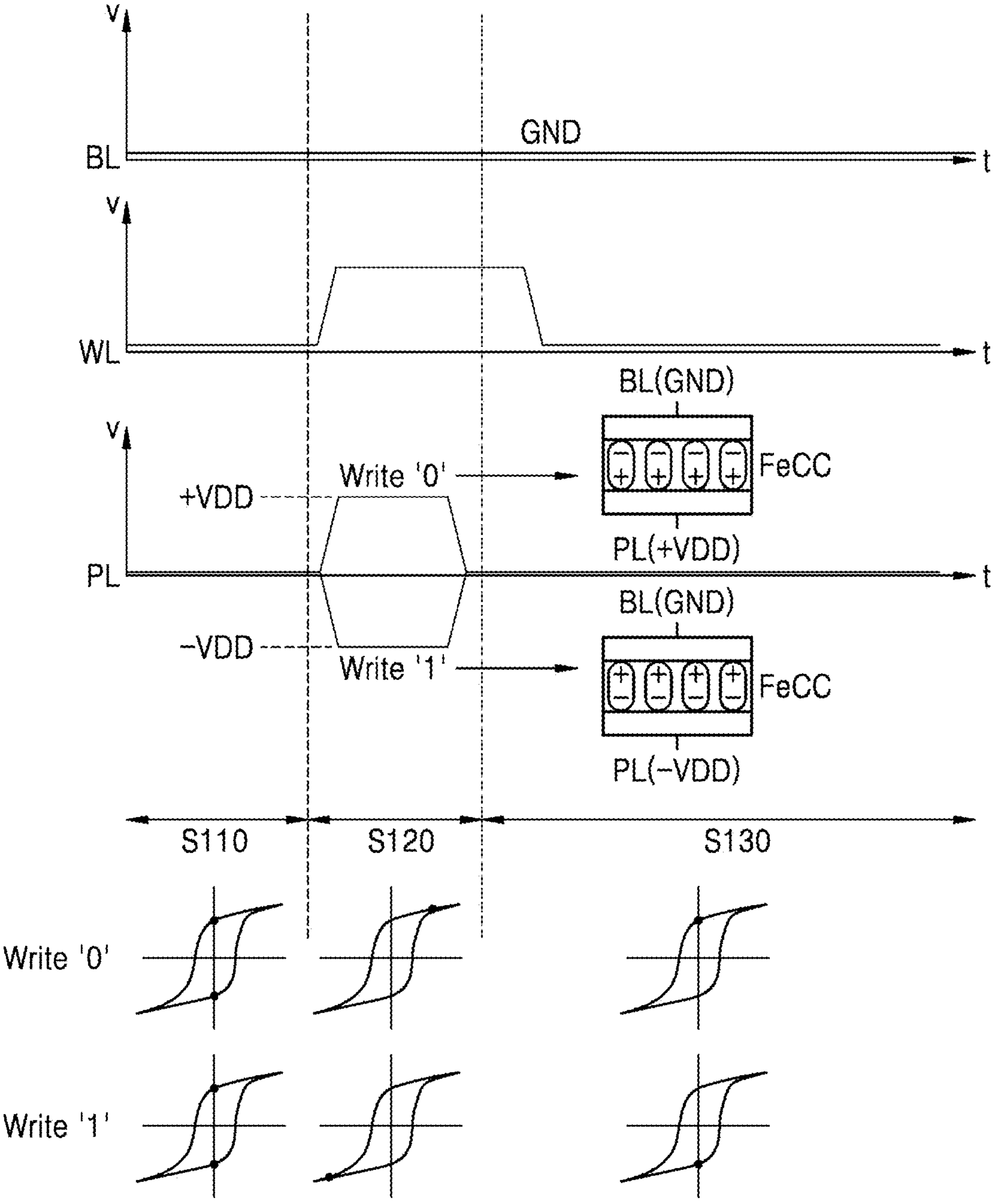
FIG. 5 is a diagram illustrating an example of a write operation of a memory device.
Figure 6:
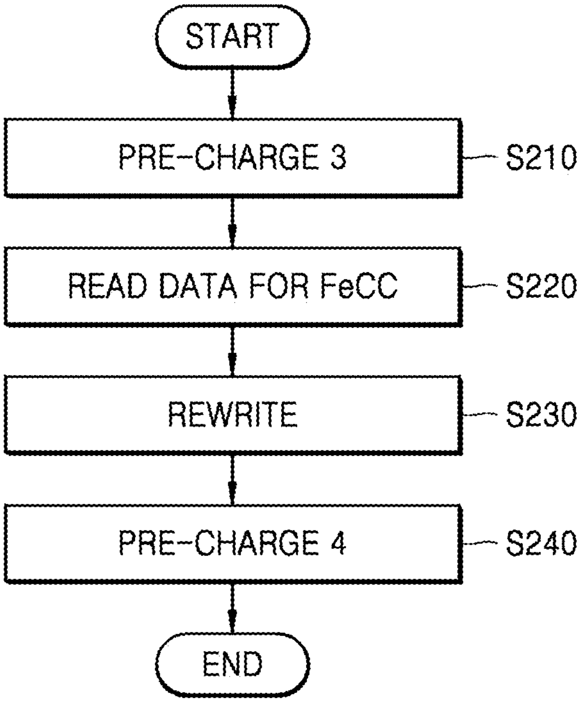
FIG. 6 is a flowchart of an example of a read operation of a memory device.

FIGS. 3A and 3B are block diagrams of an example of a memory cell MC and an example of a sense amplifier BLSA. FIG. 4 is a flowchart of an example of a write operation of a memory device. FIG. 5 is a diagram illustrating an example of a write operation of a memory device. FIG. 6 is a flowchart of an example of a read operation of a memory device. FIGS. 7A, 7B, 7C, and 8 are diagrams illustrating an example of a read operation of a memory device.

Referring to FIG. 3A, one memory cell MC among the plurality of memory cells MCs described with reference to FIG. 1 and the sense amplifier BLSA connected to the corresponding memory cell MC are shown. In this regard, components included in the memory cell MC are described with reference to FIG. 1, and thus, redundant descriptions thereof are not provided.

The sense amplifier BLSA includes a sense amplification circuit 161, and for convenience of explanation, FIG. 3A shows that an equivalent circuit of the sense amplifier BLSA includes the sense amplification circuit 161 and a parasitic capacitor CBL having a total parasitic capacitance of a bit line BL connected to the corresponding memory cell MC.

When the memory device 100 performs a read operation, the sense amplification circuit 161 may output an output voltage VOUT corresponding to data stored in the memory cell MC by comparing a reference voltage VREF with the level of a voltage applied to the parasitic capacitor CBL.

In some implementations, when the level of a voltage applied to the parasitic capacitor CBL is greater than the reference voltage VREF, the sense amplification circuit 161 may output the output voltage VOUT at a first level corresponding to "1" that is data stored in the memory cell MC. In addition, when the level of a voltage applied to the parasitic capacitor CBL is less than the reference voltage VREF, the sense amplification circuit 161 may output the output voltage VOUT at a second level corresponding to "0" that is data stored in the memory cell MC. In this regard, the first level may be greater than the second level. However, in some implementations, the first level may be less than the second level, but the inventive concept is not limited thereto.

Referring to FIG. 3B, a first memory cell MC1 may be connected to a first plate line PL1, a second memory cell MC2 may be connected to a second plate line PL2, and the first memory cell MC1 and the second memory cell MC2 may be commonly connected to a bit line BL.

The first memory cell MC1 may include a first cell transistor CT1 and a first ferroelectric cell capacitor FeCC1. The first cell transistor CT1 may be connected to a first word line WL1 and the bit line BL. The first ferroelectric cell capacitor FeCC1 may be connected to the first plate line PL1 and the first cell transistor CT1.

The second memory cell MC2 may include a second cell transistor CT2 and a second ferroelectric cell capacitor FeCC2. The second cell transistor CT2 may be connected to a second word line WL2 and the bit line BL. The second ferroelectric cell capacitor FeCC2 may be connected to the second plate line PL2 and the second cell transistor CT2.

The bit line BL may be connected to the sense amplifier BLSA. The sense amplifier BLSA may include a sense amplification circuit 162 and the parasitic capacitor CBL. Data stored in the first memory cell MC1 and data stored in the second memory cell MC2 may be selectively amplified via the bit line BL to generate the output voltage VOUT. In other words, the output voltage VOUT may output a voltage level corresponding to the data stored in one of the first memory cell MC1 and the second memory cell MC2.

An operation of writing, by the memory device 100, data stored in the memory cell MC in FIG. 3A is described with reference to FIGS. 4 and 5. However, the present disclosure is not limited thereto, and the descriptions of the memory cell MC in FIG. 3A may be applied to each of the first and second memory cells MC1 and MC2 in FIG. 3B.

Referring to FIG. 4, in operation S110, the memory device 100 may perform a pre-charge 1 operation, e.g., a first pre-charge operation. In this specification, the use of "first," "second," etc. of a charge operation is for differentiating charge operations and does not necessarily suggest or imply a sequence of charge operations. The memory device 100 may pre-charge a plate line PL connected to a ferroelectric memory cell with a first pre-charge voltage VPRE1. In this regard, the level of the first pre-charge voltage VPRE1 may be 0 V. The memory device 100 may pre-charge a bit line BL connected to the ferroelectric memory cell with a second pre-charge voltage VPRE2. The level of the second pre-charge voltage VPRE2 may be 0 V. At this time, a word line WL may be in a deactivated state, and a ground voltage may be applied to the word line WL. In this regard, the ground voltage may be expressed as GND, and the level of the ground voltage may be 0 V.

Referring to the upper side of FIG. 5, in operation S110, the plate line PL and the bit line BL may be pre-charged with a ground voltage, and a ground voltage may be applied to the word line WL.

In addition, referring to the lower side of FIG. 5, hysteresis loop characteristics of the ferroelectric cell capacitor FeCC included in the corresponding memory cell MC are shown.

An initial state of the ferroelectric cell capacitor FeCC before performing a write operation does not affect a subsequent state of the ferroelectric cell capacitor FeCC after performing the write operation. Therefore, in operation S110 shown in the lower side of FIG. 5, the point b corresponding to data "0" described with reference to FIG. 2 or the point e corresponding to data "1" described with reference to FIG. 2 are shown.

Referring back to FIG. 4, in operation S120, the memory device 100 may perform an operation of writing data to the memory cell MC including the ferroelectric cell capacitor FeCC.

The memory device 100 may activate the word line WL connected to the memory cell MC into which data is to be written.

In some implementations, the memory device 100 may apply a first driving voltage to the word line WL connected to the memory cell MC to which data is to be written. At this time, for example, the level of the first driving voltage may be VDD+VT when data "1" is written and may be −VDD+VT when data "0" is written. In this regard, +VDD may be a second driving voltage applied to the plate line PL so as to write data "0" to the memory cell MC. −VDD may be a third driving voltage applied to the plate line PL so as to write data "1" to the memory cell MC. In addition, VT may be a threshold voltage of the cell transistor CT.

Hereinafter, a case where data "1" is written to the memory cell MC is first described.

When data "1" is written to the memory cell MC including the ferroelectric cell capacitor FeCC, the memory device 100 may apply the third driving voltage −VDD to the plate line PL connected to the memory cell MC. In addition, the memory device 100 may apply a ground voltage to the bit line BL connected to the memory cell MC.

In this regard, the first driving voltage and the third driving voltage respectively applied to the word line WL and the plate line PL may be applied as pulses.

Referring to the upper side of FIG. 5, in operation S120, the level of a voltage applied to the plate line PL may decrease from the level of the ground voltage to the level of the third driving voltage −VDD, may be maintained for a certain period of time, and then may increase back to the level of the ground voltage.

In addition, referring to the upper side of FIG. 5, in operation S120 and operation S130, the level of a voltage applied to the word line WL may increase from the level of the ground voltage to the first driving voltage, may be maintained for a certain period of time, and then may decrease back to the level of the ground voltage.

In addition, referring to the upper side of FIG. 5, in operation S120, the ground voltage may be continuously applied to the bit line BL after operation S110.

Accordingly, in operation S120, a ground voltage may be applied to the upper end of the memory cell MC including the ferroelectric cell capacitor FeCC, and the third driving voltage-VDD may be applied to the lower end of the memory cell MC including the ferroelectric cell capacitor FeCC. As shown in FIG. 3A, the cell voltage Vcell may have a level of −VDD according to a voltage convention based on both ends of the ferroelectric cell capacitor FeCC. In this regard, it is assumed that the magnitude of VDD is greater than the magnitude of $V_{max}$ described with reference to FIG. 2.

Referring to the hysteresis loop characteristics of the ferroelectric cell capacitor FeCC included in the corresponding memory cell MC, shown in the lower side of FIG. 5, the cell voltage Vcell has a level of −VDD, and thus, a state of the ferroelectric cell capacitor FeCC may be the point d described with reference to FIG. 2. As described above, in this regard, regardless of the initial state of the ferroelectric cell capacitor FeCC before performing the write operation, a state of the ferroelectric cell capacitor FeCC in operation S120 may be the point d described with reference to FIG. 2.

Referring back to FIG. 4, in operation S130, the memory device 100 may perform a pre-charge 2 operation, e.g., a second pre-charge operation.

The memory device 100 may deactivate the word line WL connected to the memory cell MC into which the data has been written.

In some implementations, in operation S130, the memory device 100 may apply a ground voltage to the word line WL connected to the memory cell MC into which data is to be written. In this regard, the level of a voltage applied to the gate end of the cell transistor CT is less than the level of the threshold voltage, and thus, the word line WL connected to the memory cell MC may be deactivated.

Referring to the plot of FIG. 5 marked with "PL," in operation S130, a ground voltage may be applied to the plate line PL.

In addition, referring to plot of FIG. 5 marked with "WL," in operation S130, the level of a voltage applied to the word line WL may decrease from the level of the first driving voltage to the level of the ground voltage. In this regard, in operation S130, the word line WL may be deactivated.

In addition, referring to plot of FIG. 5 marked with "BL," in operation S130, the ground voltage may be continuously applied to the bit line BL after operation S110 and operation S120.

At this time, due to the characteristics of the ferroelectric cell capacitor FeCC, the cell voltage Vcell is finite even when the level of an external voltage is 0 V, and thus, in operation S130, when a ground voltage is applied to the lower end of the memory cell MC including the ferroelectric cell capacitor FeCC, a cell voltage Vcell 1 corresponding to data "1" may be applied to the upper end of the memory cell MC including the ferroelectric cell capacitor FeCC.

Referring to the hysteresis loop characteristics of the ferroelectric cell capacitor FeCC included in the corresponding memory cell MC, shown in the lower side of FIG. 5, the cell voltage Vcell has a level of a cell voltage corresponding to data "1", and thus, a state of the ferroelectric cell capacitor FeCC may be the point e described with reference to FIG. 2.

Hereinafter, a case where data "0" is written to the memory cell MC is described.

After operation S110, in operation S120, when data "0" is written to the memory cell MC including the ferroelectric cell capacitor FeCC, the memory device 100 may apply the second driving voltage +VDD to the plate line PL connected to the memory cell MC. In addition, the memory device 100 may apply a ground voltage to the bit line BL connected to the memory cell MC.

In this regard, the third driving voltage −VDD applied to the plate line PL when data "1" is written and the second driving voltage +VDD applied to the plate line PL when data "0" is written may have the same magnitude but different polarities.

Referring to the upper side of FIG. 5, in operation S120, the level of a voltage applied to the plate line PL may increase from the level of the ground voltage to the level of the second driving voltage +VDD, may be maintained for a certain period of time, and then may decrease back to the level of the ground voltage.

In addition, referring to the upper side of FIG. 5, in operation S120 and operation S130, the level of a voltage applied to the word line WL may increase from the level of the ground voltage to the level of the first driving voltage, may be maintained for a certain period of time, and then may decrease back to the level of the ground voltage. In this regard, in operation S120, the word line WL may be continuously activated after being activated.

In addition, referring to the upper side of FIG. 5, in operation S120, the ground voltage may be continuously applied to the bit line BL after operation S110.

Accordingly, in operation S120, the third driving voltage −VDD may be applied to the upper end of the memory cell MC including the ferroelectric cell capacitor FeCC, and the ground voltage may be applied to the lower end of the memory cell MC including the ferroelectric cell capacitor FeCC. As shown in FIG. 3A, the cell voltage Vcell may have a level of +VDD according to the voltage convention based on both ends of the ferroelectric cell capacitor FeCC. In this regard, it is assumed that the magnitude of VDD is greater than the magnitude of $V_{max}$ described with reference to FIG. 2.

Referring to the hysteresis loop characteristics of the ferroelectric cell capacitor FeCC included in the corresponding memory cell MC, shown in the lower side of FIG. 5, the cell voltage Vcell has a level of +VDD, and thus, a state of the ferroelectric cell capacitor FeCC may be the point a described with reference to FIG. 2. As described above, in this regard, regardless of the initial state of the ferroelectric cell capacitor FeCC before performing the write operation, a state of the ferroelectric cell capacitor FeCC in operation S120 may be the point a described with reference to FIG. 2.

Referring back to FIG. 4, in operation S130, the memory device 100 (for example, the sense amplifier BLSA) may perform the pre-charge 2 operation.

The memory device 100 may deactivate the word line WL connected to the memory cell MC into which the data has been written.

In some implementations, in operation S130, the memory device 100 may apply a ground voltage to the word line WL connected to the memory cell MC into which data is to be written. In this regard, the level of a voltage applied to the gate end of the cell transistor CT is less than the level of the threshold voltage, and thus, the word line WL connected to the memory cell MC may be deactivated.

Referring to the upper side of FIG. 5, in operation S130, a ground voltage may be applied to the plate line PL.

In addition, referring to the upper side of FIG. 5, in operation S130, the level of a voltage applied to the word line WL may decrease from the level of the first driving voltage to the level of the ground voltage. In other words, in operation S130, the word line WL may be deactivated.

In addition, referring to the upper side of FIG. 5, in operation S130, the ground voltage may be continuously applied to the bit line BL after operation S110 and operation S120.

At this time, due to the characteristics of the ferroelectric cell capacitor FeCC, the cell voltage Vcell may exist even when the level of an external voltage is 0 V. Therefore, in operation S130, when a ground voltage is applied to the lower end of the memory cell MC including the ferroelectric cell capacitor FeCC, a cell voltage Vcell 0 corresponding to data "0" may be applied to the upper end of the memory cell MC including the ferroelectric cell capacitor FeCC.

Referring to the hysteresis loop characteristics of the ferroelectric cell capacitor FeCC included in the corresponding memory cell MC, shown in the lower side of FIG. 5, the cell voltage Vcell has a level of a cell voltage corresponding to data "0", and thus, a state of the ferroelectric cell capacitor FeCC may be the point b described with reference to FIG. 2.

Hereinafter, an operation of reading, by the memory device 100, data stored in one memory cell MC is described with reference to FIGS. 6, 7A, 7B, 7C, and 8.

Referring to FIG. 6, in operation S210, the memory device 100 may perform a pre-charge 3 operation, e.g., a third pre-charge operation. The memory device 100 may pre-charge a plate line PL connected to the memory cell MC to be read with a pre-charge voltage. In this regard, the pre-charge voltage may be a ground voltage. Furthermore, the memory device 100 may pre-charge a bit line BL connected to the memory cell MC with a ground voltage. In other words, the bit line BL may be in a deactivated state. A word line WL may be deactivated by applying a ground voltage to the word line WL.

Figure 7A:
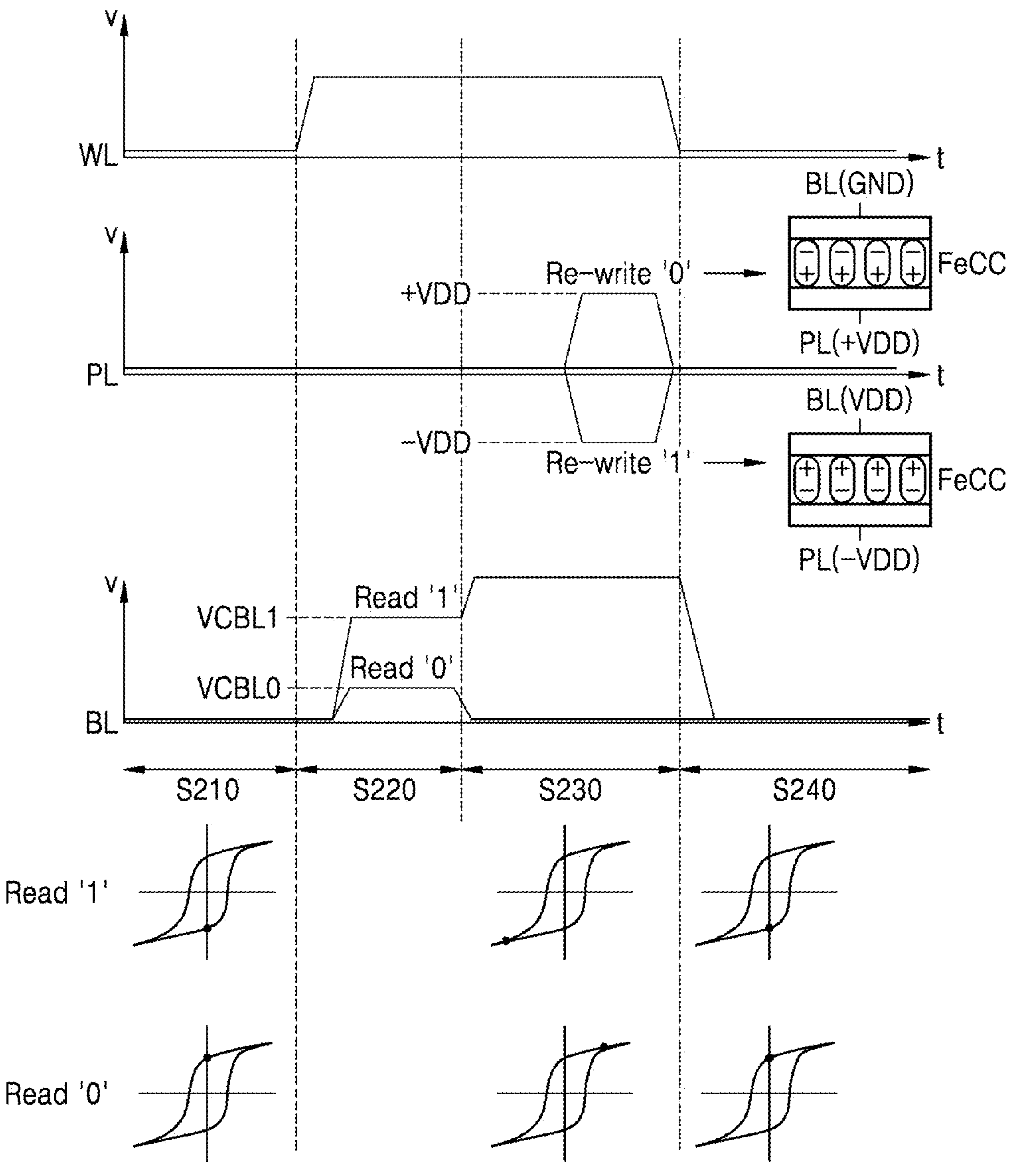
FIGS. 7A, 7B, 7C, and 8 are diagrams illustrating an example of a read operation of a memory device.

Referring to the upper side of FIG. 7A, the levels of voltages applied to the bit line BL, the word line WL, and the plate line PL of the corresponding memory cell MC are shown according to time.

Referring to the upper side of FIG. 7A, in operation S210, the plate line PL and the bit line BL may be pre-charged with a ground voltage, and the word line WL may be deactivated. During the deactivation of the word line WL, a ground voltage may be applied to the word line WL.

In addition, referring to the lower side of FIG. 7A, hysteresis loop characteristics of the ferroelectric cell capacitor FeCC included in the corresponding memory cell MC are shown.

An initial state of the ferroelectric cell capacitor FeCC may be a state of the point e described with reference to FIG. 2, at which data "1" is stored, or may be a state of point b described with reference to FIG. 2, at which data "0" is stored.

Referring back to FIG. 6, in operation S220, the memory device 100 may perform an operation of reading data from the memory cell MC including the ferroelectric cell capacitor FeCC.

The memory device 100 may activate the word line WL connected to the memory cell MC from which data is to be read.

In some implementations, the memory device 100 may apply a first driving voltage to the word line WL connected to the memory cell MC from which data is to be read. At this time, for example, the level of the first driving voltage may be any level of VT or more. In this regard, VT may be a threshold voltage of the cell transistor CT.

In operation S220, when the word line WL connected to the memory cell MC is activated, the sense amplifier BLSA may perform a charge sharing operation.

Specifically, because, in operation S210, a voltage applied to the bit line BL is pre-charged with the ground voltage, in operation S220, some of charges stored in the ferroelectric cell capacitor FeCC move to the bit line BL connected to the memory cell MC, resulting in an increase in charges stored in the parasitic capacitor CBL in the equivalent circuit shown in FIG. 3A. In other words, the charge sharing operation may be understood as the parasitic capacitor CBL shown in FIG. 3A being additionally connected in parallel to the ferroelectric cell capacitor FeCC to which the cell voltage Vcell is applied.

Therefore, in operation S220, the magnitude of the cell voltage Vcell of the ferroelectric cell capacitor FeCC decreases, and the degree to which the cell voltage Vcell decreases may vary depending on stored data. In addition, the magnitude of the existing cell voltage Vcell may vary depending on the stored data.

Figure 8:
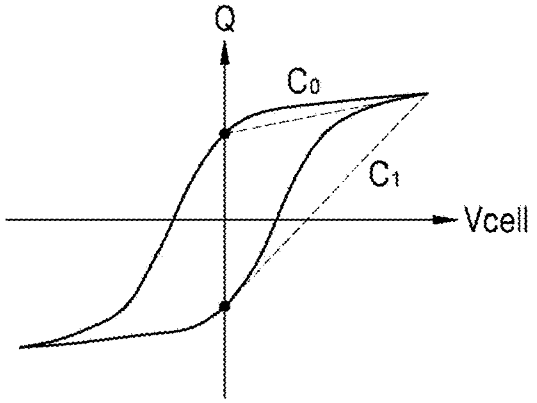

FIG. 8 is a graph linearizing a hysteresis loop shown in FIG. 2 with two linear capacitors ($C_0$ and $C_1$). In this regard, $C_0$ represents a capacitance CFeCC 0 of the ferroelectric cell capacitor FeCC storing data "0" and $C_1$ represents a capacitance CFeCC 1 of the ferroelectric cell capacitor FeCC storing data "1".

In operation S220, the level of a voltage VCBL applied to the bit line BL may be approximated as shown in Equation 1 below.

$$VCBL_X = \begin{cases} VCBL_1 = \dfrac{CFeCC_1}{CFeCC_1 + C_{BL}}(-VCELL_1) \\ \text{(if the stored data is "1")} \\ VCBL_0 = \dfrac{CFeCC_0}{CFeCC_0 + C_{BL}}(-VCELL_0) \\ \text{(if the stored data is "0")} \end{cases} \quad \text{[Equation 1]}$$

In this regard, $VCBL_x$ refers to the level of a sense voltage sensed on the bit line BL according to data x, $CFeCC_0$ refers to the capacitance of the ferroelectric cell capacitor FeCC storing data "0", $CFeCC_1$ refers to the capacitance of the ferroelectric cell capacitor FeCC storing data "1", CBL refers to the total parasitic capacitance of the bit line BL connected to the corresponding memory cell MC, $VCELL_1$ refers to the cell voltage Vcell corresponding to data "1" right after a write operation, and $VCELL_0$ refers to the cell voltage Vcell corresponding to data "0" right after a write operation.

In other words, during a read operation, the memory device 100 may read data stored in the memory cell MC, based on the cell voltage Vcell of the ferroelectric cell capacitor FeCC before the word line WL connected to the memory cell MC is activated.

Alternatively, during a read operation, the memory device 100 may read data stored in the memory cell MC, based on the level of a voltage sensed on the bit line BL after the word line WL connected to the memory cell MC is activated. In this regard, the level of the voltage applied to the bit line BL after the word line WL connected to the memory cell MC is activated may vary depending on data stored in the memory cell MC.

Hereinafter, a case where data "1" stored in the memory cell MC is read is first described.

After operation S210, in operation S220, the memory device 100 may apply a first driving voltage to the word line WL connected to the memory cell MC from which data is to be read. At this time, for example, the level of the first driving voltage may be any level of VT or more. In this regard, VT may be a threshold voltage of the cell transistor CT.

When data "1" stored in the memory cell MC including the ferroelectric cell capacitor FeCC is read, the memory device 100 (for example, the sense amplifier BLSA) may read the corresponding data by sensing a first sense voltage (for example, VCBL1) applied to the bit line BL connected to the memory cell MC. In this regard, the memory device 100 may apply a ground voltage to the plate line PL connected to the memory cell MC.

Referring to the upper side of FIG. 7A, in operation S220, the level of the voltage sensed on the bit line BL connected to the memory cell MC may increase from the level of the ground voltage to the level of the first sense voltage (for example, VCBL1) and then may be maintained for a certain period of time.

In this regard, the first driving voltage applied to the word line WL may be applied as a pulse. Referring to the upper side of FIG. 7A, in operation S220 and operation S230, the level of a voltage applied to the word line WL may increase from the level of the ground voltage to the level of the first driving voltage, may be maintained for a certain period of time, and then may decrease back to the level of the ground voltage. In other words, in operation S220 and operation S230, the word line WL may be continuously activated.

In addition, referring to the upper side of FIG. 7A, in operation S220, the ground voltage may be continuously applied to the plate line PL after operation S210.

When the memory device 100 performs a read operation, the sense amplification circuit 161 may output the output voltage VOUT having a voltage level corresponding to "1", which is data stored in the memory cell MC, by comparing the reference voltage VREF with the level of a voltage applied to the parasitic capacitor CBL. In this regard, the voltage applied to the parasitic capacitor CBL may correspond to the first sense voltage (for example, VCBL1) sensed on the bit line BL connected to the memory cell MC.

In some implementations, because the level of the voltage (e.g., the first sense voltage (for example, VCBL1)) applied to the parasitic capacitor CBL is greater than the reference voltage VREF, the sense amplification circuit 161 may output the output voltage VOUT having a voltage level corresponding to "1" that is data stored in the memory cell MC.

Referring back to FIG. 6, in operation S230, the memory device 100 may perform a rewrite operation.

Specifically, when the memory device 100 rewrites data "1" to the memory cell MC including the ferroelectric cell capacitor FeCC, the memory device 100 may apply the second driving voltage +VDD to the bit line BL connected to the memory cell MC. In addition, the memory device 100 may apply the third driving voltage −VDD to the plate line PL connected to the memory cell MC. The word line WL may be continuously activated in operation S230 after being activated in operation S220. In other words, after operation S220, in operation S230, the memory device 100 may continuously apply the first driving voltage to the word line WL.

Referring to the upper side of FIG. 7A, in operation S230, the level of the voltage applied to the bit line BL may increase from the first sense voltage (for example, VCBL1) to the second driving voltage +VDD, may be maintained for a certain period of time, and then may decrease back to the ground voltage.

In addition, referring to the upper side of FIG. 7A, in operation S230, the level of the voltage applied to the word line WL may be maintained with the first driving voltage. In other words, in operation S220 and operation S230, the word line WL may be continuously activated.

Accordingly, in operation S230, the second driving voltage +VDD may be applied to the upper end of the memory cell MC including the ferroelectric cell capacitor FeCC, and the third driving voltage −VDD may be applied to the lower end of the memory cell MC including the ferroelectric cell capacitor FeCC. As shown in FIG. 3A, the cell voltage Vcell may have a level of −2VDD according to the voltage convention based on both ends of the ferroelectric cell capacitor FeCC. In this regard, it is assumed that the magnitude of VDD is greater than the magnitude of $V_{max}$ described with reference to FIG. 2.

Referring to the hysteresis loop characteristics of the ferroelectric cell capacitor FeCC included in the corresponding memory cell MC, shown in the lower side of FIG. 7A, because the cell voltage Vcell has a level of −2VDD, the cell voltage Vcell on a hysteresis curve may be understood as −VDD that is the minimum value, and a state of the ferroelectric cell capacitor FeCC may be the point d described with reference to FIG. 2.

Referring back to FIG. 6, in operation S240, the memory device 100 may perform a pre-charge 4 operation, e.g., a fourth pre-charge operation.

The memory device 100 may deactivate the word line WL connected to the memory cell MC to which data has been rewritten.

In some implementations, in operation S240, the memory device 100 may apply a ground voltage to the word line WL connected to the memory cell MC from which data is to be read. In this regard, the level of a voltage applied to the gate end of the cell transistor CT is less than the level of the threshold voltage, and thus, the word line WL connected to the memory cell MC may be deactivated.

Referring to the upper side of FIG. 7A, in operation S240, a ground voltage may be applied to the bit line BL.

In addition, referring to the upper side of FIG. 7A, in operation S240, the level of the voltage applied to the word line WL may decrease from the level of the first driving voltage to the level of the ground voltage. In other words, in operation S240, the word line WL may be deactivated.

In addition, referring to the upper side of FIG. 7A, the level of a voltage applied to the plate line PL may increase from the level of the third driving voltage −VDD to the level of the ground voltage.

At this time, due to the characteristics of the ferroelectric cell capacitor FeCC, the cell voltage Vcell may be finite even when the level of an external voltage is 0 V. Therefore, in operation S240, when a ground voltage is applied to the lower end of the memory cell MC including the ferroelectric cell capacitor FeCC, the cell voltage Vcell 1 corresponding to data "1" may be applied to the upper end of the memory cell MC including the ferroelectric cell capacitor FeCC.

Referring to the hysteresis loop characteristics of the ferroelectric cell capacitor FeCC included in the corresponding memory cell MC, shown in the lower side of FIG. 7A, the cell voltage Vcell has a level of a cell voltage corresponding to data "1", and thus, a state of the ferroelectric cell capacitor FeCC may be the point e described with reference to FIG. 2.

Hereinafter, a case where data "0" stored in the memory cell MC is read is described.

After operation S210, in operation S220, the memory device 100 may apply a first driving voltage to the word line WL connected to the memory cell MC from which data is to be read. At this time, for example, the level of the first driving voltage may be any level of VT or more. In this regard, VT may be a threshold voltage of the cell transistor CT.

When data "O" stored in the memory cell MC including the ferroelectric cell capacitor FeCC is read, the memory device 100 (for example, the sense amplifier BLSA) may read the corresponding data by sensing a first sense voltage (for example, VCBL0) applied to the bit line BL connected to the memory cell MC. In this regard, the memory device 100 may apply a ground voltage GND to the plate line PL connected to the memory cell MC.

Referring to the upper side of FIG. 7A, in operation S220, the level of a voltage sensed on the bit line BL connected to the memory cell MC may increase from the level of the ground voltage to the level of a second sense voltage (for example, VCBL0) and then may be maintained for a certain period of time.

In this regard, the first driving voltage applied to the word line WL may be applied as a pulse. Referring to the upper side of FIG. 7A, in operation S220 and operation S230, the level of a voltage applied to the word line WL may increase from the level of the ground voltage to the level of the first driving voltage, may be maintained for a certain period of time, and then may decrease back to the level of the ground voltage. In other words, in operation S220 and operation S230, the word line WL may be continuously activated after being activated.

In addition, referring to the upper side of FIG. 7A, in operation S220, the ground voltage may be continuously applied to the plate line PL after operation S210.

When the memory device 100 performs a read operation, the sense amplification circuit 161 may output the output voltage VOUT having a voltage level corresponding to "0", which is data stored in the memory cell MC, by comparing the reference voltage VREF with the level of a voltage applied to the parasitic capacitor CBL. In this regard, the voltage applied to the parasitic capacitor CBL may correspond to the second sense voltage (for example, VCBL0) sensed on the bit line BL connected to the memory cell MC.

In some implementations, because the level of the voltage (e.g., the second sense voltage (for example, VCBL0)) applied to the parasitic capacitor CBL is less than the reference voltage VREF, the sense amplification circuit 161 may output the output voltage VOUT having a voltage level corresponding to "0" that is data stored in the memory cell MC.

Referring back to FIG. 6, in operation S230, the memory device 100 may perform a rewrite operation.

Specifically, when the memory device 100 rewrites data "0" to the memory cell MC including the ferroelectric cell capacitor FeCC, the memory device 100 may apply the ground voltage GND to the bit line BL connected to the memory cell MC.

In addition, the memory device 100 may apply the second driving voltage +VDD to the plate line PL connected to the memory cell MC. The word line WL may be continuously activated in operation S230 after being activated in operation S220. In other words, after operation S220, in operation S230, the memory device 100 may continuously apply the first driving voltage to the word line WL.

Referring to the upper side of FIG. 7A, in operation S230, the level of the voltage applied to the bit line BL may decrease from the second sense voltage (for example, VCBL0) to the level of the ground voltage GND.

In addition, referring to the upper side of FIG. 7A, in operation S230, the level of the voltage applied to the word line WL may be maintained with the first driving voltage. In other words, in operation S220 and operation S230, the word line WL may be continuously activated after being activated.

In addition, referring to the upper side of FIG. 7A, in operation S230, the second driving voltage +VDD may be applied to the plate line PL.

Accordingly, in operation S230, the third driving voltage −VDD may be applied to the upper end of the memory cell MC including the ferroelectric cell capacitor FeCC, and the ground voltage GND may be applied to the lower end of the memory cell MC including the ferroelectric cell capacitor FeCC. As shown in FIG. 3A, the cell voltage Vcell may have a level of +VDD according to the voltage convention based on both ends of the ferroelectric cell capacitor FeCC. In this regard, it is assumed that the magnitude of VDD is greater than the magnitude of V max described with reference to FIG. 2.

Referring to the hysteresis loop characteristics of the ferroelectric cell capacitor FeCC included in the corresponding memory cell MC, shown in the lower side of FIG. 7A, the cell voltage Vcell has a level of +VDD, and thus, a state of the ferroelectric cell capacitor FeCC may be the point a described with reference to FIG. 2.

Referring back to FIG. 6, in operation S240, the memory device 100 (for example, the sense amplifier BLSA) may perform the pre-charge 4 operation.

The memory device 100 may deactivate the word line WL connected to the memory cell MC to which data has been rewritten.

In some implementations, in operation S240, the memory device 100 may apply a ground voltage to the word line WL connected to the memory cell MC from which data is to be read. In this regard, the level of a voltage applied to the gate end of the cell transistor CT is less than the level of the threshold voltage, and thus, the word line WL connected to the memory cell MC may be deactivated.

Referring to the upper side of FIG. 7A, in operation S240, a ground voltage may be applied to the bit line BL.

In addition, referring to the upper side of FIG. 7A, in operation S240, the level of the voltage applied to the word line WL may decrease from the level of the first driving voltage to the level of the ground voltage. In other words, in operation S240, the word line WL may be deactivated.

In addition, referring to the upper side of FIG. 7A, a ground voltage may be applied to the plate line PL.

At this time, due to the characteristics of the ferroelectric cell capacitor FeCC, the cell voltage Vcell may exist even when the level of an external voltage is 0 V. Therefore, in operation S240, when the ground voltage GND is applied to the lower end of the memory cell MC including the ferroelectric cell capacitor FeCC, the cell voltage Vcell 0 corresponding to data "O" may be applied to the upper end of the memory cell MC including the ferroelectric cell capacitor FeCC.

Referring to the hysteresis loop characteristics of the ferroelectric cell capacitor FeCC included in the corresponding memory cell MC, shown in the lower side of FIG. 7, the cell voltage Vcell has a level of a cell voltage corresponding to data "0", and thus, a state of the ferroelectric cell capacitor FeCC may be the point b described with reference to FIG. 2.

Figure 7B:
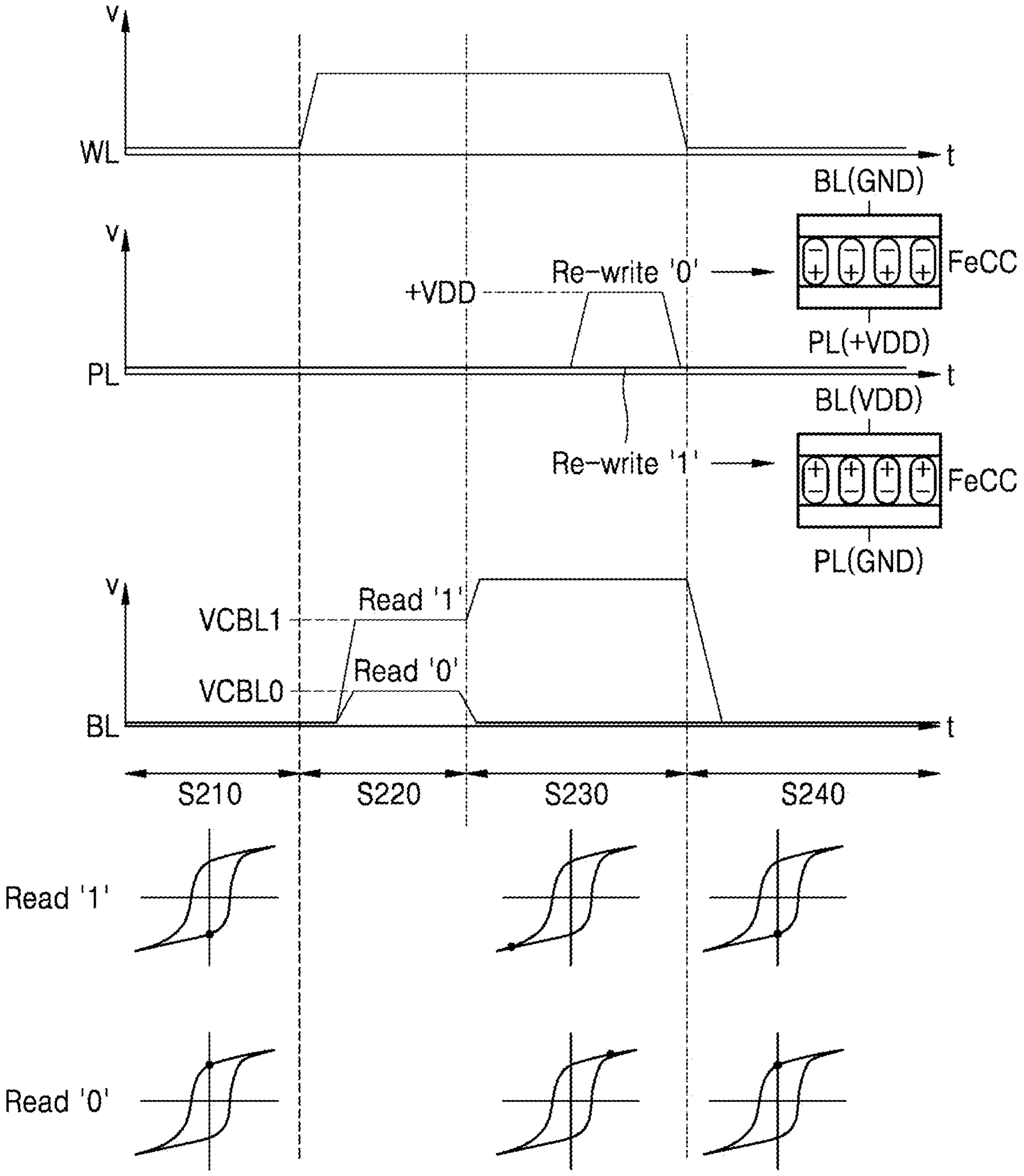

Referring to FIG. 7B, unlike FIG. 7A, in operation S230, when data "1" is written, a ground voltage may be applied to the plate line PL. Even when a ground voltage is applied to the plate line PL, the second driving voltage +VDD is applied to the bit line BL, and thus, as shown in FIG. 3A, the cell voltage Vcell may have a level of +VDD according to the voltage convention based on both ends of the ferroelectric cell capacitor FeCC. Referring to the hysteresis loop characteristics of the ferroelectric cell capacitor FeCC, the cell voltage Vcell has a level of a cell voltage corresponding to data "1", and thus, a state of the ferroelectric cell capacitor FeCC may be the point b described with reference to FIG. 2.

Figure 7C:
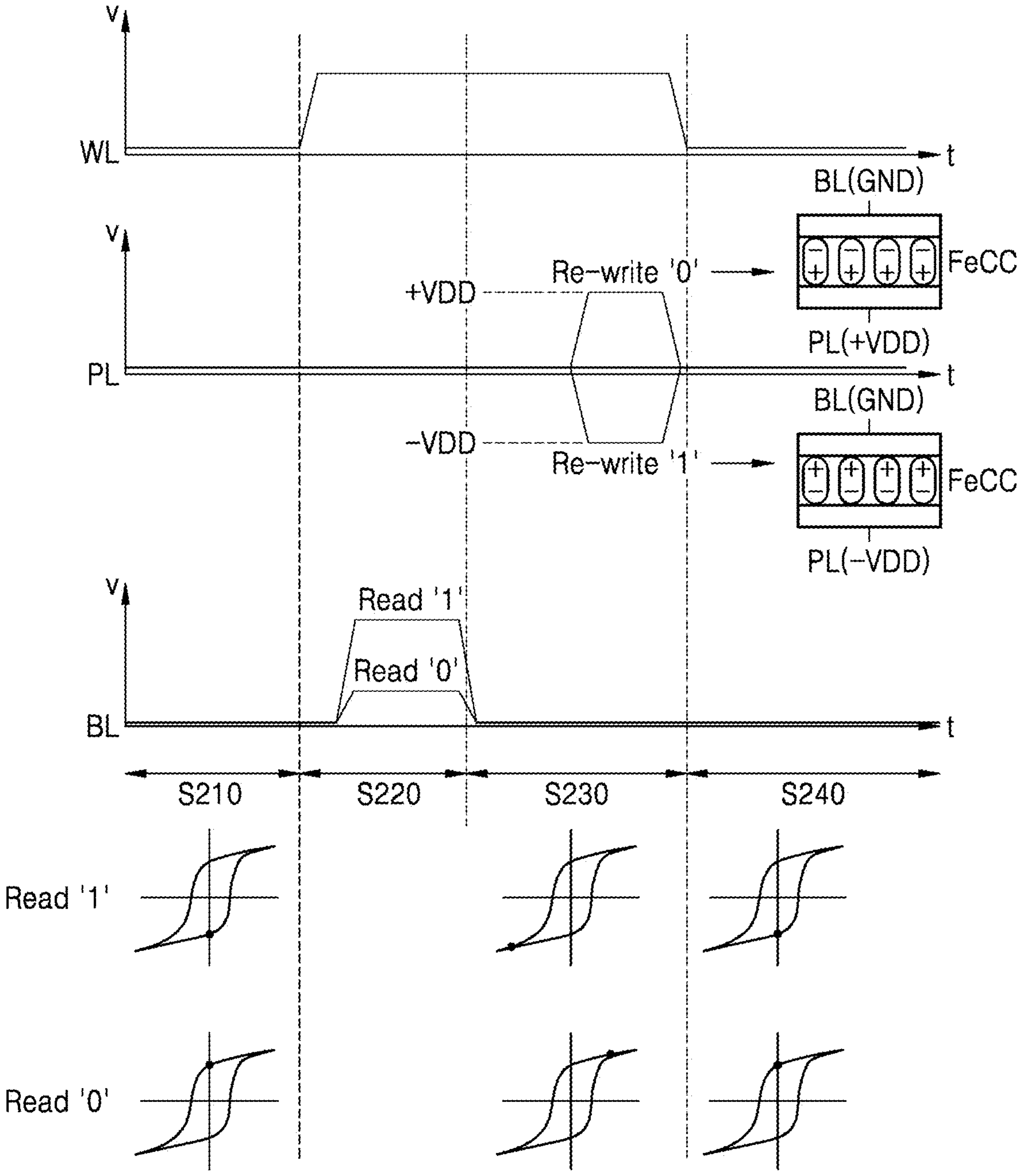

Referring to FIG. 7C, unlike FIG. 7A, in operation S230, a ground voltage may be applied to the bit line BL. Even when a ground voltage is applied to the bit line BL, as described with reference FIG. 5, data "0" and "1" may be rewritten to the ferroelectric cell capacitor FeCC by using the second and third driving voltages +VDD and −VDD applied to the plate line PL. In other words, in a state where the ground voltage GND is applied to the bit line BL, when the second driving voltage +VDD is applied to the plate line PL, data "0" may be rewritten to the ferroelectric cell capacitor FeCC. In addition, in a state where the ground voltage GND is applied to the bit line BL, when the third driving voltage −VDD is applied to the plate line PL, data "1" may be rewritten to the ferroelectric cell capacitor FeCC.

Figure 9:
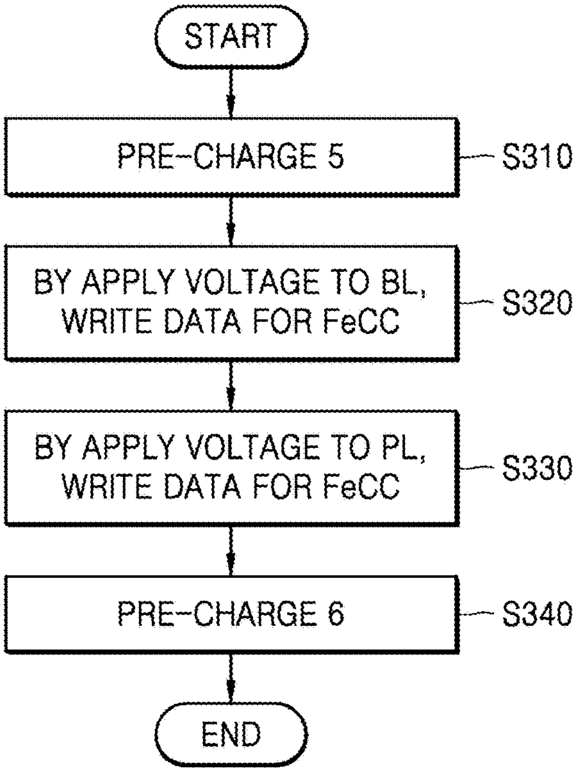
FIG. 9 is a flowchart of an example of a write operation of a memory device.
Figure 10:
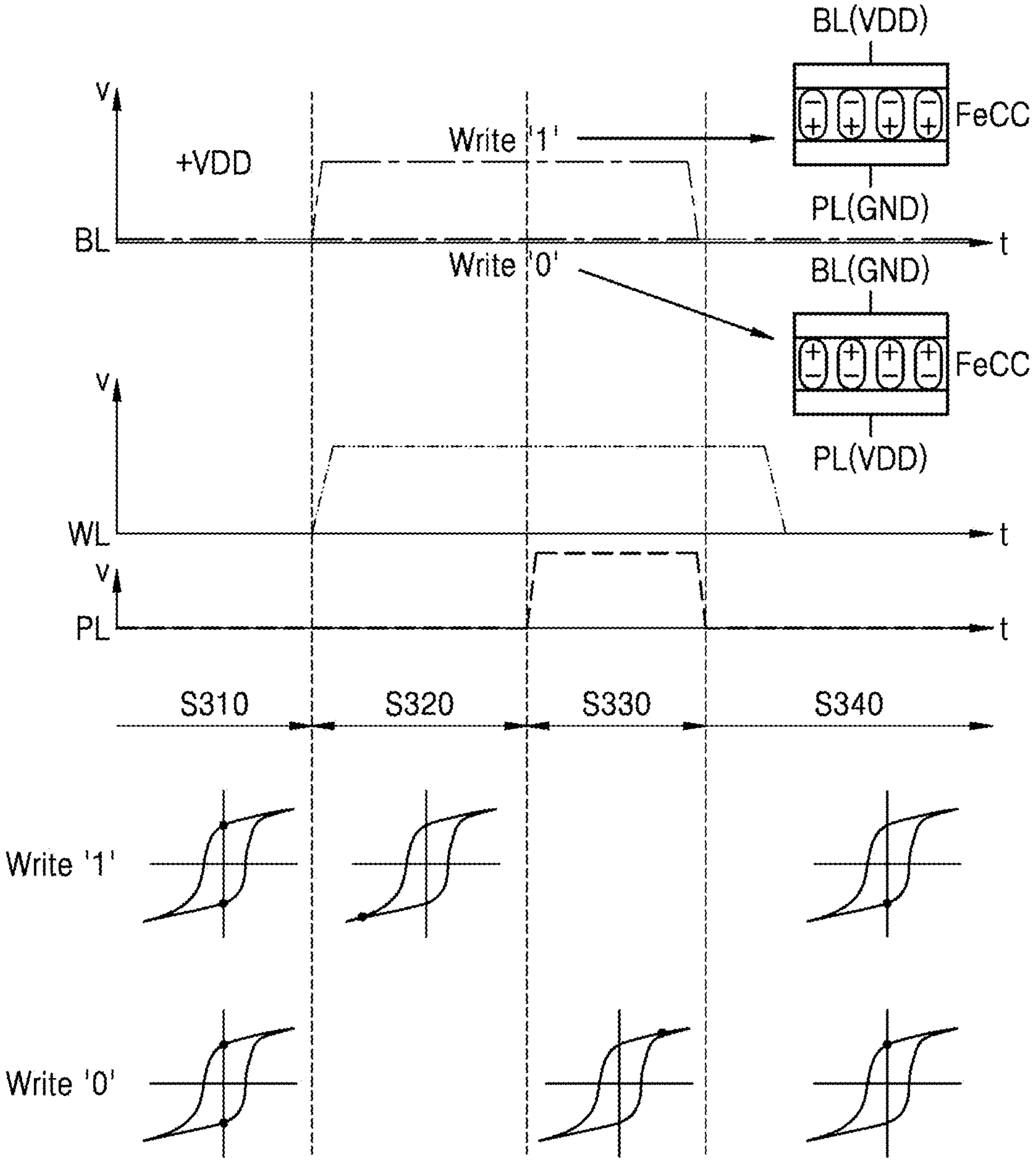
FIG. 10 is a diagram illustrating an example of a write operation of a memory device.
Figure 11:
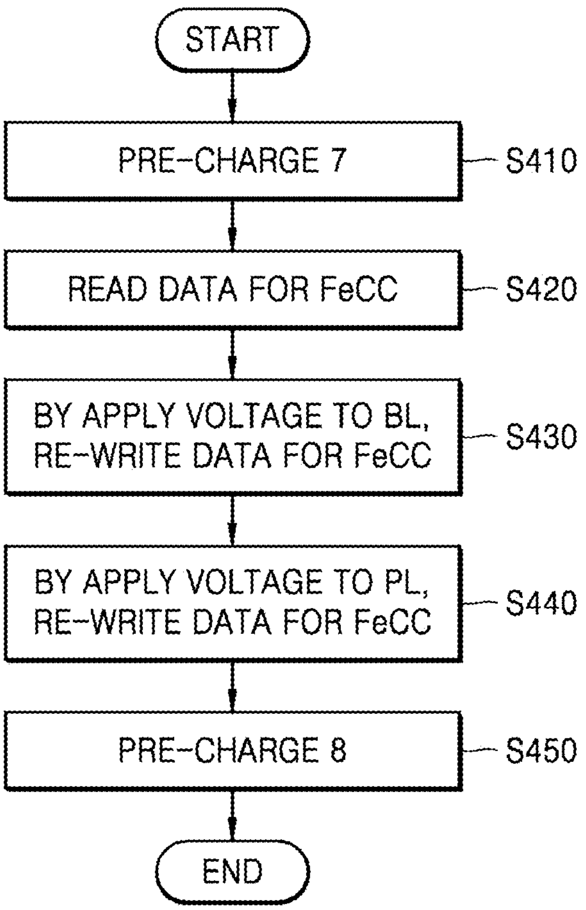
FIG. 11 is a flowchart of an example of a read operation of a memory device.
Figure 12:
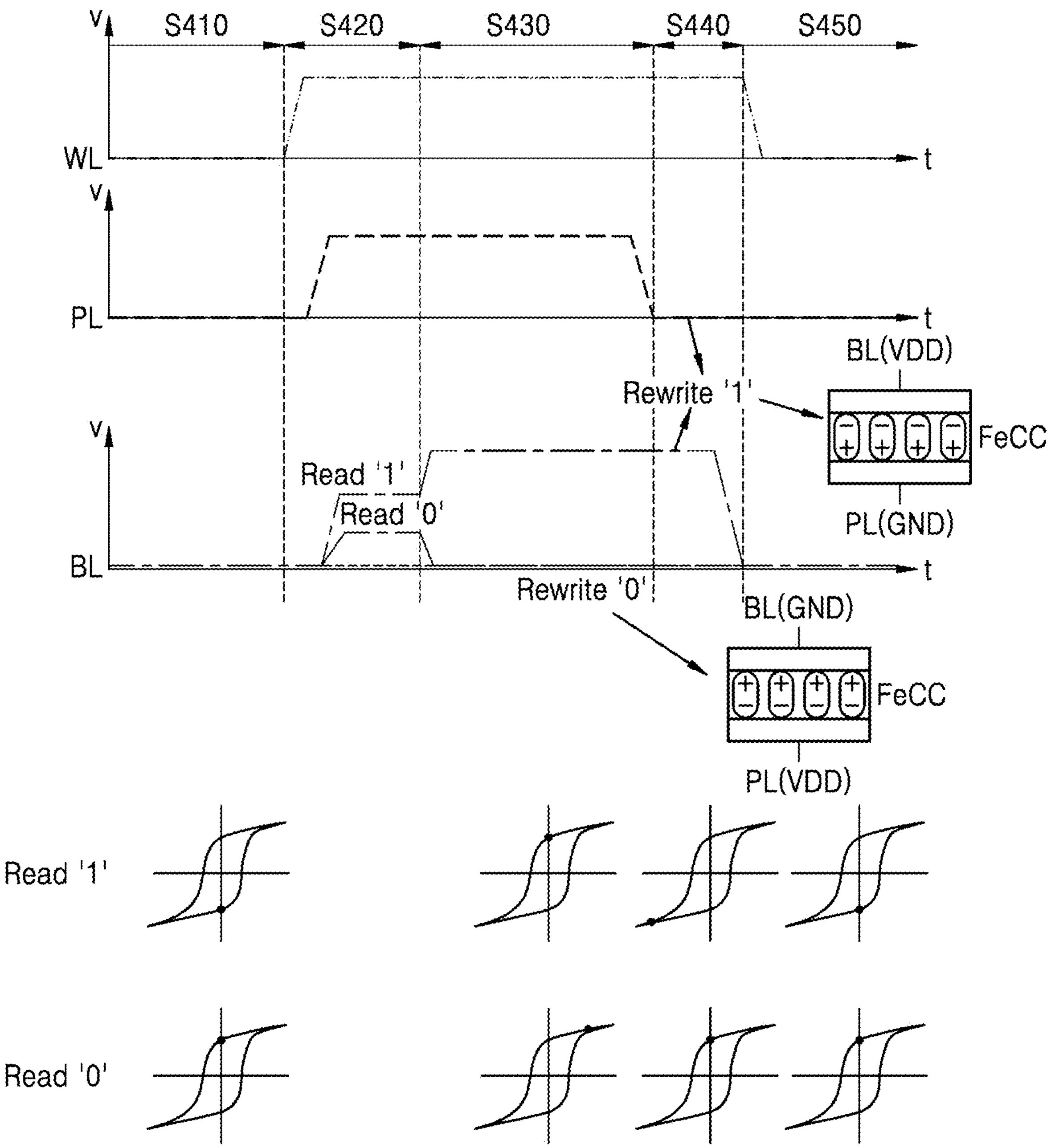
FIG. 12 is a diagram illustrating an example of a read operation of a memory device.

FIG. 9 is a flowchart of a write operation of an example of a memory device. FIG. 10 is a diagram illustrating an example of a write operation of a memory device. FIG. 11 is a flowchart of an example of a read operation of a memory device. FIG. 12 is a diagram illustrating an example of a read operation of a memory device.

Hereinafter, an example of a write operation of the memory device 100 is described with reference to FIGS. 9 and 10.

Referring to FIG. 9, in operation S310, the memory device 100 may perform a pre-charge 5 operation, e.g., a fifth pre-charge operation. Referring to FIG. 10, during a first time period, e.g., time period corresponding to S310, the pre-charge 5 operation occurs. In this specification, the use of "first," "second," etc. of a time period is for differentiating time periods and does not necessarily suggest or imply a sequence of time periods. the bit line BL and the plate line PL are pre-charged with a ground voltage, and a ground voltage may be applied to the word line WL.

Hereinafter, a case where data "1" is written to the memory cell MC is described.

After operation S310, in operation S320, the memory device 100 applies a fourth driving voltage to the word line WL connected to the memory cell MC to which data is to be written, and the memory device 100 applies a fifth driving voltage +VDD to the bit line BL connected to the memory cell MC to which data is to be written. Referring to the lower side of FIG. 10, a state of the ferroelectric cell capacitor FeCC at this time corresponds to the point d described with reference to FIG. 2.

Referring back to FIG. 9, in operation S330, the memory device 100 applies a sixth driving voltage to the plate line PL connected to the memory cell MC to which data is to be written and applies the fifth driving voltage +VDD to the bit line BL. Referring to FIG. 10, the sixth driving voltage applied to the plate line PL is applied as a pulse to the plate line PL in operation S330.

Referring back to FIG. 9, in operation S340, the memory device 100 may perform a pre-charge 6 operation, e.g., a sixth pre-charge operation. The ground voltage GND is applied to the word line WL to deactivate the word line WL.

A method of writing data "0" to the memory cell MC is also similar to a method of writing data "1" to the memory cell MC, which is described above, and thus, descriptions thereof are not provided.

Hereinafter, a read operation of the memory device 100 according to a comparative example is described with reference to FIGS. 11 and 12.

Referring to FIG. 11, in operation S410, the memory device 100 performs the pre-charge 7 operation, e.g., a seventh pre-charge operation. Referring to FIG. 12, the bit line BL is pre-charged with a ground voltage, and a ground voltage is applied to the word line WL and the plate line PL.

Hereinafter, a case where data "1" stored in the memory cell MC is read is described.

Referring to FIG. 11, after operation S410, in operation S420, the memory device 100 activates the word line WL and the plate line PL, which are connected to the memory cell MC, and the sense amplifier BLSA performs a charge sharing operation. In this regard, the memory device 100 applies the fourth driving voltage to the word line WL connected to the memory cell MC from which data is to be read and applies the sixth driving voltage to the plate line PL connected to the memory cell MC from which data is to be read.

Referring to FIG. 12, in operation S420, the memory device 100 reads data stored in the memory cell MC, based on the level of a voltage sensed on the bit line BL after the word line WL connected to the memory cell MC is activated.

Referring back to FIG. 11, in operation S430, the memory device 100 applies the fifth driving voltage +VDD to the bit line BL connected to the memory cell MC to which data is to be rewritten. Referring to the lower side of FIG. 12, a state of the ferroelectric cell capacitor FeCC at this time corresponds to the point b described with reference to FIG. 2.

In addition, after the sixth driving voltage is applied to the plate line PL for a certain period of time, while the ground voltage GND is applied to the plate line PL, operation S440 in FIG. 11 is initiated.

Referring to the lower side of FIG. 12, a state of the ferroelectric cell capacitor FeCC in operation S440 corresponds to the point d described with reference to FIG. 2.

In addition, after the fifth driving voltage +VDD is applied to the bit line BL for a certain period of time in operation S440, while a ground voltage is applied to the bit line BL, operation S450 in FIG. 11 is initiated.

Referring back to FIG. 11, in operation S450, the memory device 100 may perform a pre-charge 8 operation, e.g., an eighth pre-charge operation. The ground voltage GND is applied to the word line WL to deactivate the word line WL. Referring to the lower side of FIG. 12, a state of the ferroelectric cell capacitor FeCC in operation S450 corresponds to the point e described with reference to FIG. 2.

Figure 13A:
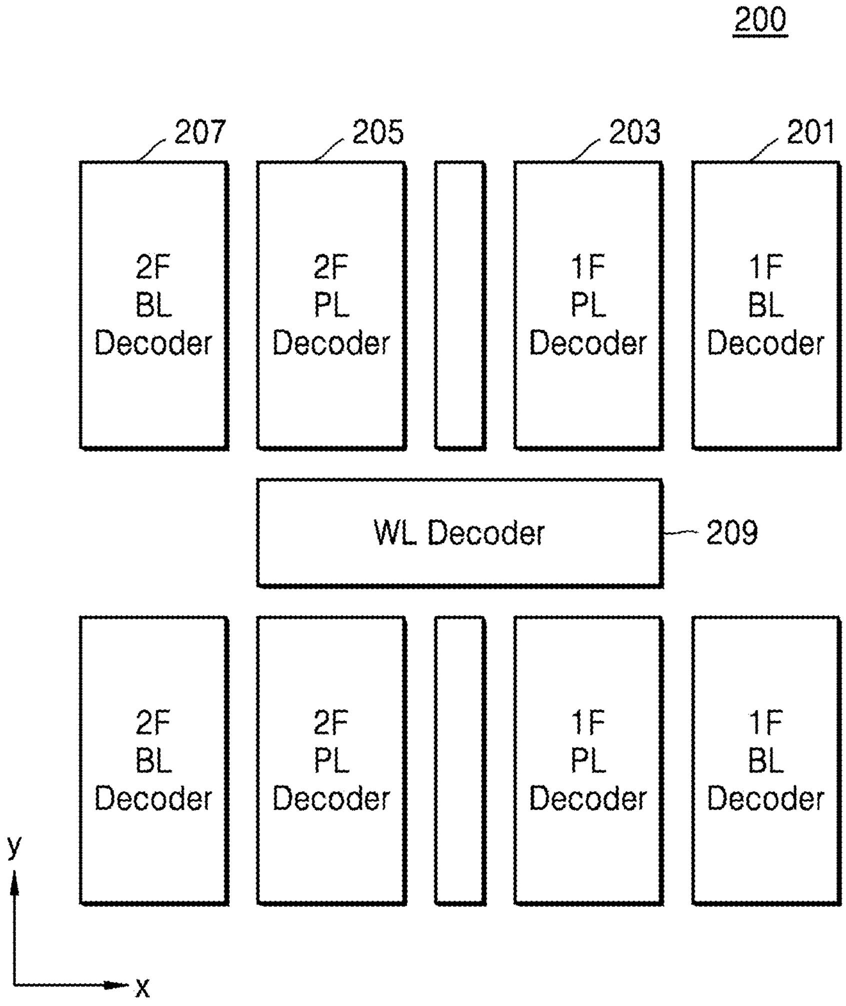
FIGS. 13A and 13B are diagrams illustrating an example of a layout of a memory device.
Figure 13B:
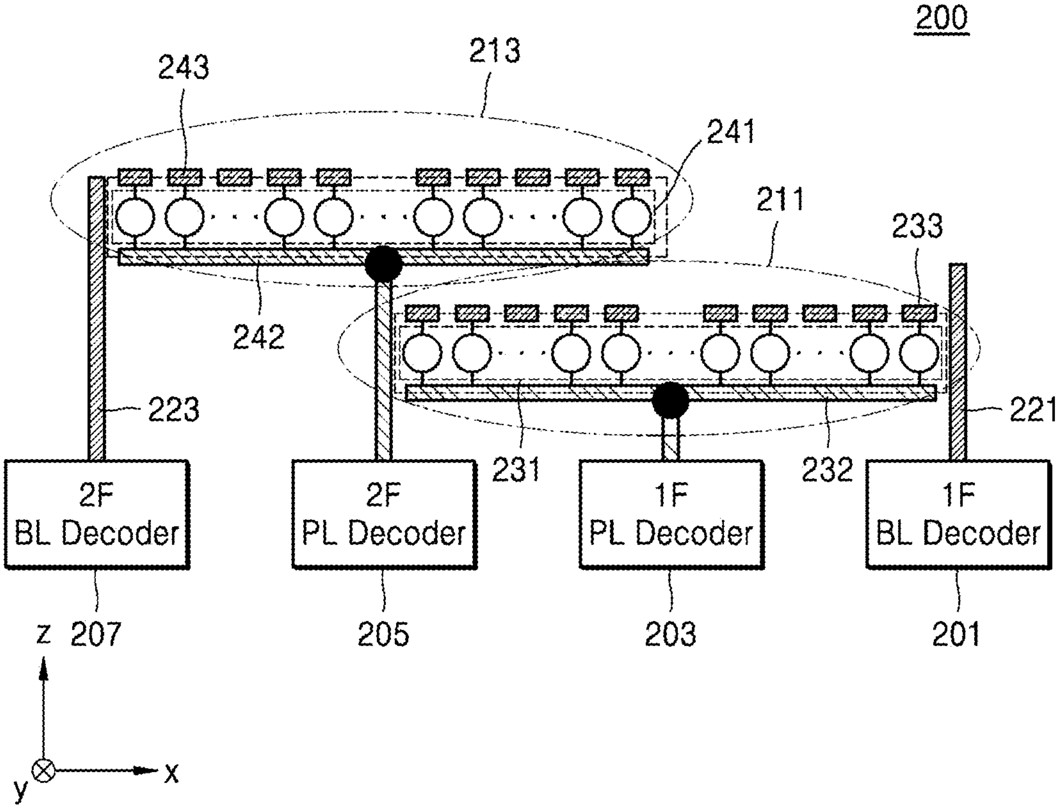
Figure 14A:
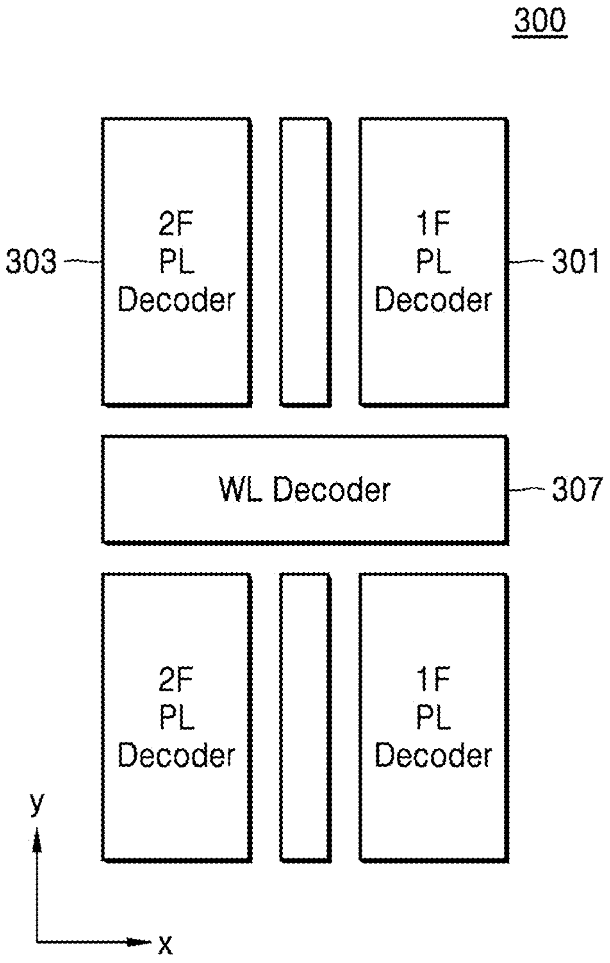
FIGS. 14A and 14B are diagrams illustrating an example of a layout of a memory device.
Figure 14B:
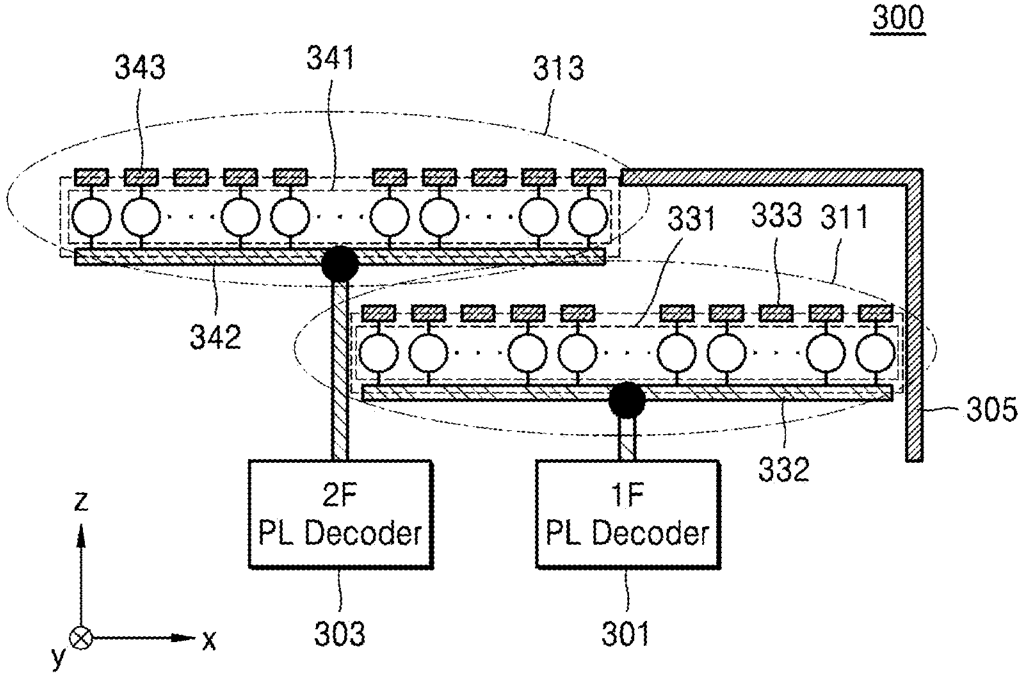

FIGS. 13A and 13B are diagrams illustrating an example of a layout of a memory device. FIGS. 14A and 14B are diagrams illustrating an example of a layout of a memory device.

FIG. 13A is a layout showing a horizontal cross-section of a memory device 200 according to a comparative example, and FIG. 13B is a layout showing a vertical cross-section of the memory device 200. FIG. 14A is a layout showing a horizontal cross-section of a memory device 300 In some implementations, and FIG. 14B is a layout showing a vertical cross-section of the memory device 300.

Referring to FIGS. 13A and 13B, the memory device 200 includes a first bit line decoder 201 connected to a first layer 211, a first plate line decoder 203 connected to the first layer 211, a second plate line decoder 205 connected to a second layer 213, a second bit line decoder 207 connected to the second layer 213, and a word line decoder 209. In this regard, the word line decoder 209 may be connected to the memory cell MC included in the first layer 211 and the second layer 213. In addition, the above-described components may be implemented as a tile structure on a wafer substrate.

Referring to FIG. 13B, the first layer 211 includes a plurality of memory cells 231. Each of the plurality of memory cells 231 may include a ferroelectric capacitor. The lower end of a memory cell 231 included in the first layer 211 may be connected to the first plate line decoder 203 via a plate line 232, and the upper end of the memory cell 231 included in the first layer 211 may be connected to the first bit line decoder 201 via bit lines 233 and 221. The second layer 213 may include a plurality of memory cells 241. Each of the plurality of memory cells 241 may include a ferroelectric capacitor. The lower end of a memory cell 241 included in the second layer 213 may be connected to the second plate line decoder 205 via a plate line 242, and the upper end of the memory cell 241 included in the second layer 213 may be connected to the second bit line decoder 207 via bit lines 243 and 223.

Referring to FIGS. 14A and 14B, the memory device 300 includes a first plate line decoder 301 connected to a first layer 311, a second plate line decoder 303 connected to a second layer 313, and a word line decoder 307. Although not shown, the memory device 300 may further include a common bit line decoder commonly connected to the first layer 311 and the second layer 313. In this regard, the word line decoder 307 may be connected to the first layer 311 and the second layer 313. In addition, the above-described components may be implemented as a tile structure on a wafer substrate.

Referring to FIG. 14B, each of the first layer 311 and the second layer 313 includes a plurality of memory cells. The lower end of a memory cell 331 included in the first layer 311 may be connected to the first plate line decoder 301, the lower end of a memory cell 341 included in the second layer 313 may be connected to the second plate line decoder 303, and the upper end of the memory cell 331 included in the first layer 311 and the upper end of the memory cell 341 included in the second layer 313 may be connected to a common bit line 305 via bit lines 333 and 343. In other words, regardless of whether there is a first layer or a second layer, that is, without layer distinction, the upper ends of the memory cells 331 and 341 may be connected to the common bit line 305.

In other words, the memory device 200 of FIGS. 13A and 13B, depending on the implementation, has different driving voltages for each bit line so as to perform the write operation of FIG. 9 and the read operation of FIG. 11, and thus, individual bit line decoders (for example, the first and second bit line decoders 201 and 207) should be necessarily included. However, the memory device 300 of FIGS. 14A and 14B, In some implementations, may perform the write operation of FIG. 4 and the read operation of FIG. 6 by using the common bit line 305 to which the ground voltage GND is applied. In other words, the memory device 300 may perform the write operation of FIG. 4 and the read operation of FIG. 6 by using only the common bit line 305, e.g., not the changing a voltage of the bit line during a write operation.

Accordingly, the memory device may reduce the amount of resources required for the area previously occupied by a bit line decoder, e.g., by omitting the bit line decoder, thereby increasing efficiency with respect to the designable area during circuit design.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the inventive concept has been particularly shown and described with reference to example embodiments thereof, it will be understood that various changes in form and details may be made therein without departing from the spirit and scope of the following claims.

What is claimed is:

1. An operating method of a memory device, the method comprising:

during a first time period in a write operation, pre-charging a bit line, commonly connected to a first memory cell in a first layer of the memory device and a second memory cell in a second layer of the memory device, with a ground voltage;

during a second time period in the write operation, applying a word line driving voltage to a word line corresponding to the bit line;

in the second time period, applying a plate line driving voltage to a plate line connected to the first memory cell; and in the second time period, maintaining a voltage applied to the bit line at the ground voltage, wherein the memory device comprises:

a first plate line decoder connected to the first layer;

a second plate line decoder connected to the second layer; and a word line decoder connected to the first layer and the second layer.

2. The operating method of claim 1, wherein applying of the plate line driving voltage to the plate line comprises:

applying a positive first plate line driving voltage to the plate line during writing of first data; and applying a negative second plate line driving voltage to the plate line during writing of second data.

3. The operating method of claim 2, wherein a magnitude of the first plate line driving voltage is equal to a magnitude of the second plate line driving voltage.

4. The operating method of claim 1, further comprising:

during a third time period in the write operation, applying the ground voltage to the word line;

in the third time period, applying the ground voltage to the plate line; and in the third time period, maintaining a voltage applied to the bit line at the ground voltage.

5. The operating method of claim 1, further comprising:

during a fourth time period in a read operation, pre-charging the bit line with the ground voltage;

during a fifth time period in the read operation, reading data stored in the memory cell by performing a charge sharing operation; and during a sixth time period in the read operation, rewriting the data to the memory cell by applying the plate line driving voltage to the plate line.

6. The operating method of claim 5, wherein rewriting of the data to the memory cell comprises:

in the sixth time period, applying a positive first plate line driving voltage to the plate line during rewriting of a first portion of the data; and in the sixth time period, applying a negative second plate line driving voltage to the plate line during rewriting of a second portion of the data.

7. The operating method of claim 6, wherein rewriting of the data to the memory cell further comprises, in the sixth time period, applying the ground voltage to the bit line.

8. The operating method of claim 5, wherein rewriting of the data to the memory cell comprises:

in the sixth time period, applying a positive first plate line driving voltage to the plate line during rewriting of first data; and in the sixth time period, applying the ground voltage to the plate line during rewriting of second data.

9. The operating method of claim 6, wherein rewriting of the data to the memory cell comprises, in a seventh time period, applying the ground voltage to the word line, the plate line, and the bit line.

10. An operating method of a memory device, the method comprising:

during a first time period in a read operation, applying a ground voltage to a first plate line connected to a first memory cell in a first layer of the memory device and a second plate line connected to a second memory cell in a second layer of the memory device;

in the first time period, applying the ground voltage to a bit line commonly connected to the first memory cell and the second memory cell;

during a second time period in the read operation, reading data stored in one of the first memory cell and the second memory cell by performing a charge sharing operation;

during a third time period in the read operation, applying a first plate line driving voltage to a plate line corresponding to a memory cell storing first data among the first and second memory cells; and in the third time period, applying a second plate line driving voltage to a plate line corresponding to a memory cell storing second data among the first and second memory cells, wherein the memory device comprises:

a first plate line decoder connected to the first layer;

a second plate line decoder connected to the second layer; and a word line decoder connected to the first layer and the second layer.

11. The operating method of claim 10, wherein the first plate line driving voltage has a positive level, and wherein the second plate line driving voltage has a negative level.

12. The operating method of claim 11, wherein a magnitude of the first plate line driving voltage is equal to a magnitude of the second plate line driving voltage.

13. The operating method of claim 10, wherein the first plate line driving voltage has a positive level, and wherein the second plate line driving voltage is the ground voltage.

14. The operating method of claim 10, further comprising, in the third time period, applying the ground voltage to the bit line.

15. A memory device comprising:

a memory cell array comprising a first layer comprising a plurality of first memory cells and a second layer comprising a plurality of second memory cells;

a first plate line decoder connected to the first layer;

a second plate line decoder connected to the second layer;

a common bit line connected to the first layer and the second layer; and a word line decoder connected to the first layer and the second layer, wherein, during a write operation on the memory cell array, a voltage applied to the common bit line is maintained at a ground voltage.

16. The memory device of claim 15, wherein the first plate line decoder is configured to apply, during writing of first data to the first memory cells, a first plate line driving voltage to a first plate line connected to the first memory cells, and the second plate line decoder is configured to apply, during writing of second data to the second memory cells, a second plate line driving voltage to a second plate line connected to the second memory cells while the first plate line decoder applies the first plate line driving voltage.

17. The memory device of claim 16, wherein, while the first plate line decoder applies the first plate line driving voltage to the first plate line and the second plate line decoder applies the second plate line driving voltage to the second plate line, the word line decoder is configured to activate a word line connected to the plurality of first memory cells and the plurality of second memory cells.

18. The memory device of claim 16, wherein the first plate line driving voltage has a positive level, and wherein the second plate line driving voltage has a negative level.

19. The memory device of claim 18, wherein a magnitude of the first plate line driving voltage is equal to a magnitude of the second plate line driving voltage.

20. The memory device of claim 15, wherein the first plate line decoder and the second plate line decoder are configured to apply the ground voltage to the first plate line and the second plate line when data is written to the memory cell array.

* * * * *